(12) United States Patent
Shimazu et al.

(10) Patent No.: US 6,894,295 B2
(45) Date of Patent: May 17, 2005

(54) ELECTRON BEAM PROXIMITY EXPOSURE APPARATUS AND MASK UNIT THEREFOR

(75) Inventors: Nobuo Shimazu, Machida (JP); Takao Utsumi, Watchung (JP)

(73) Assignee: LEEPL Corporation, Machida (JP)

( * ) Notice: Subject to any disclaimer, the term of this patent is extended or adjusted under 35 U.S.C. 154(b) by 667 days.

(21) Appl. No.: 09/732,928

(22) Filed: Dec. 11, 2000

(65) Prior Publication Data

US 2002/0070356 A1 Jun. 13, 2002

(51) Int. Cl.$^7$ ................................................ H01J 37/20
(52) U.S. Cl. ........................... 250/492.22; 250/492.1; 250/492.2; 250/492.23; 430/5
(58) Field of Search ..................... 250/492.2, 492.21, 250/492.22, 492.23, 492.24, 492.3, 492.1, 398; 430/5

(56) References Cited

U.S. PATENT DOCUMENTS

| | | | |
|---|---|---|---|
| 5,547,788 A | * 8/1996 | Han et al. ...................... | 430/5 |
| 5,831,272 A | 11/1998 | Utsumi | |
| 5,851,707 A | * 12/1998 | Shibuya et al. ................ | 430/5 |
| 5,874,198 A | * 2/1999 | Okino ........................... | 430/5 |
| 5,923,562 A | * 7/1999 | Liebmann et al. ............. | 430/5 |
| 6,327,022 B1 | * 12/2001 | Nishi ............................ | 355/53 |
| 6,352,802 B1 | * 3/2002 | Miyasaka ...................... | 430/5 |

OTHER PUBLICATIONS

High Throughput Submicron Lithography with Electron Beam Proximity Pringing, H. Bohlen et al., Solid State Technology, Sep. 1984, pp. 210–217.

Low Energy Electron–Beam Proximity Projection Lithography: Discover of Missing Link, Takao Utsumi, J. Vac. Sci. Technol. B 17(6), Nov./Dec. 1999, pp. 2897–2902.

* cited by examiner

Primary Examiner—Nikita Wells
Assistant Examiner—James P. Hughes
(74) Attorney, Agent, or Firm—Nixon Peabody LLP; David S. Safran (57) ABSTRACT

In an electron beam proximity exposure apparatus comprising an electron beam source, which emits a collimated electron beam, a mask substrate on which a plurality of masks with apertures are formed, a mask moving mechanism, which moves the mask substrate, and a stage, which holds and moves an object, the mask moving mechanism moves the mask substrate so that one of the plurality of masks is arranged on a path of the electron beam in proximity to a surface of the object, and a pattern corresponding to the aperture of the one of the plurality of masks is exposed on the surface of the object with the electron beam having passed through the aperture. Thus, the frequency of taking the mask out of the apparatus to exchange the mask is reduced, so that the throughput of the apparatus is improved.

7 Claims, 7 Drawing Sheets

ELECTRON BEAM PROXIMITY EXPOSURE APPARATUS AND MASK UNIT THEREFOR

BACKGROUND OF THE INVENTION

1. Field of the Invention

The present invention relates to an exposure apparatus, which is used to expose fine patterns in a manufacturing process of semiconductor integrated circuits, etc., and a mask unit used therefor, and more particularly to an electron beam proximity exposure apparatus, in which a mask having apertures corresponding to a pattern to be exposed is disposed in proximity to a surface of an object such as a semiconductor wafer, the mask is irradiated with an electron beam, and exposure of the pattern with the electron beam having passed through the apertures is thereby performed, and a mask unit used therefor.

2. Description of the Related Art

Attempts are being made to enhance integration degrees of semiconductor integrated circuits and finer circuit patterns are desired. Presently, a limit of the finer circuit patterns is defined mainly by exposure apparatuses, and a stepper, which is an optical exposure apparatus, takes various measures such as a light source that emits rays having shorter wavelengths, a larger NA (numerical aperture) and a phase shift method. However, much finer circuit patterns involve various kinds of problems such as a rapid increase of manufacturing costs. New types of exposure apparatus such as an electron beam direct lithography apparatus and an X-ray exposure apparatus have been therefore developed, but there still remain many problems in terms of stability, productivity, cost, etc.

An electron beam proximity exposure system is conventionally under research and development, since the exposure principle thereof is simple, as "High Throughput Submicron Lithography with Electron Beam Proximity Printing" (H. Bohlen et al., Solid State Technology, September 1984, pp. 210–217) (hereinafter referred to as a literature 1) exemplifies. However, it was thought that it was of no practical use since it was difficult to eliminate the proximity effect peculiar to the electron beam.

U.S. Pat. No. 5,831,272 (corresponding to Japanese Patent No. 2951947) and "Low energy electron-beam proximity projection lithography: Discovery of missing link" (Takao Utsumi, J. Vac. Sci. Technol. B 17(6), November/December 1999, pp. 2897–2902) disclose an electron beam proximity exposure apparatus that overcomes the above-mentioned problems and is usable for processing with very fine resolution at a mass production level.

Figure 1:
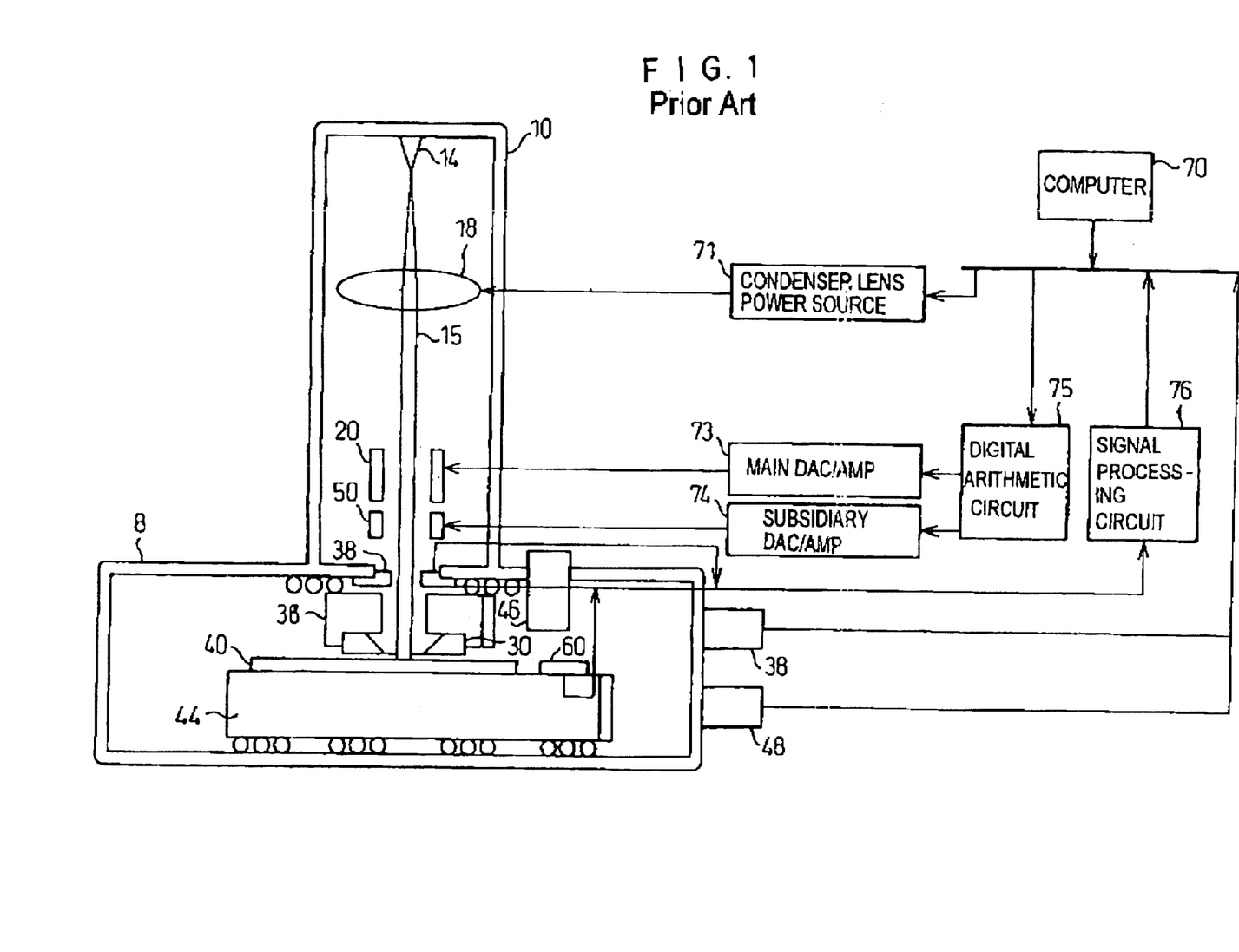
FIG. 1 is a view showing a fundamental configuration of an electron beam proximity exposure apparatus.

FIG. 1 is a view showing a fundamental configuration to realize the electron beam proximity exposure apparatus disclosed in U.S. Pat. No. 5,831,272. As shown in FIG. 1, in an electron optical column 10 are disposed an electron gun 14, which emits an electron beam 15, a condenser lens 18, which collimates the electron beam 15, a main deflecting device 20 and a subsidiary deflecting device 50. Although the main deflecting device 20 is shown as a single deflecting device in FIG. 1, it is actually configured in two stages so as to obtain electron beams that are in parallel with an optical axis and have different irradiating locations by deflecting an electron beam with a deflecting device in the first stage and then in a reverse amount with a deflecting device in the second stage. Similarly, the subsidiary deflecting device 50 is also configured actually in two stages so that fine adjustment of an irradiating angle is possible without changing the irradiating locations changed with the main deflecting devices by deflecting the electron beams with a deflecting device in the first stage and then in a reverse amount twice as large with a deflecting device in the second stage. In a vacuum object chamber 8 are disposed a mask stage 36, which holds and moves a mask 30, a reflected electron detector 38, which detects reflected electrons, a wafer stage 44, which holds and moves a wafer 40, a standard mark 60 disposed on the wafer stage 44, and a height measurer 46, which measures a height of the surface of the wafer 40. A laser length measuring device 38 for the mask stage, which measures a travel amount of the mask stage 36, and a laser length measuring device 48 for the wafer stage, which measures a travel amount of the wafer stage 44, are disposed so that the travel amounts of the stages can be measured with remarkably high accuracy. The wafer stage 44 is movable in directions of at least two axes. Although the reflected electron detector 38 is used in this configuration, a secondary electron detector, which detects secondary electrons, can also be provided in place of the reflected electron detector.

The electron beam proximity exposure apparatus is controlled by a computer 70. Signals detected by the laser length measuring device 38 for the mask stage and the laser length measuring device 48 for the wafer stage are supplied to a data bus of the computer 70. Signals detected by the reflected electron detector 38, a detector disposed on the standard mark and the height measurer 46 are supplied to a signal processing circuit 76, converted into digital signals and then supplied to the data bus of the computer 70. The condenser lens 18 is an electromagnetic lens or an electrostatic lens, which is controlled by the computer 70 by way of a condenser lens power source 71. The computer 70 supplies deflection amount data to a digital arithmetic circuit 75, which performs an operation to correct the deflection amount data according to previously stored correction data and supplies corrected data to a main DAC/AMP 73 and a subsidiary DAC/AMP 74. The main DAC/AMP 73 and the subsidiary DAC/AMP 74 convert the corrected deflection amount data into analog signals, amplify the analog signals and supply the resulting signals to the main deflecting device 20 and the subsidiary deflecting device 50, respectively. The electron beam is deflected as desired accordingly.

The exposure apparatus described above positions the wafer 40 to the mask and exposes a pattern over an entire surface of the mask by scanning with the electron beam 15.

FIGS. 2(A) and 2(B) are a plan view and a sectional view, respectively, of the mask used in the electron beam proximity exposure apparatus. The mask 30 is a thin plate member with a thickness of a few millimeters, for example, and center portion denoted with a reference number 32 is processed in the thickness of few micrometers, where an aperture pattern is formed in a portion denoted with a reference number 33 within. A reference number 35 denotes a mark for determining a mask's position.

Figure 3:
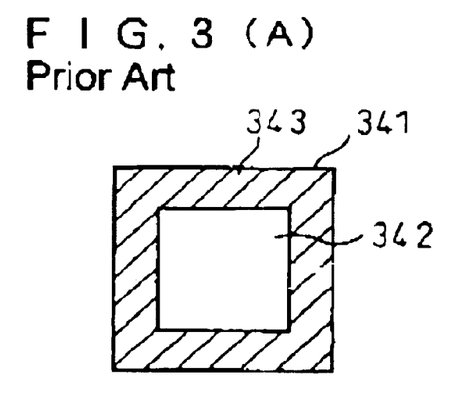
FIGS. 3(A), 3(B) and 3(C) are explanatory views illustrating complementary masks.

The mask 30 to be used in the above-described electron beam proximity exposure apparatus is a stencil mask having the aperture parts formed as perforations. With the stencil mask, an annular pattern that has a small square pattern 342 in a large square pattern 341 and an aperture as a portion 343 between the large and small square patterns as shown in FIG. 3(A), for example, cannot be exposed with a single mask, and it is necessary to divide this annular pattern into two pairs of patterns 344 and 345 and patterns 346 and 347 as shown in FIGS. 3(B) and 3(C), and expose these patterns in two stages. Such two masks for the exposure of a single pattern are hereafter called complementary masks. In other words, it is necessary to prepare two complementary masks for proximity exposure, perform exposure by the electron beam proximity exposure apparatus in which one (e.g., with the patterns 344 and 345) of the masks is set, and then perform exposure by the electron beam proximity exposure apparatus in which the other mask (e.g., with the patterns 346 and 347) is set. In this case, however, it is necessary after the first exposure to take the wafer out of the vacuum chamber into an atmospheric environment and carry the wafer again into the vacuum chamber of the electron beam proximity exposure apparatus for the second exposure. In other words, it is necessary to repeatedly carry the wafer between the vacuum condition and the atmospheric condition. Accordingly, it arises not only a problem of lowered the throughput but also a problem to allow dust and the like to easily adhere, thereby lowering the yield.

In a case of a photomask to be used in an optical light exposure apparatus such as a stepper, a pattern is formed on a glass substrate with a chromium layer or the like, and then a pellicle layer is formed as a protective film on the pattern. Although the surface of the pellicle layer is monitored for dust adhesion and the surface of the pellicle layer is cleaned to remove the dust in a case that dust adheres on a problematic level, the cleaning does not damage the pattern. The surface of the pellicle layer causes defocusing by its thickness and no particular problem occurs so far as the adhering dust consists of small particles.

In contrast, the mask 30 to be used in the above-described electron beam proximity exposure apparatus is required to be the stencil mask having the aperture parts formed as the perforations, on which the above-described pellicle layer cannot be formed. Therefore, dust or the like adhering to the surface of the mask causes a serious problem in the above-described electron beam proximity exposure apparatus. In a case that the mask is deteriorated by the adhering dust inside the electron beam proximity exposure apparatus, the surface of the mask is hardly cleaned directly, and an apparatus such as a correcting device or a cleaning device is used to remove the dust. However, since the mask is required to be taken out of the electron beam proximity exposure apparatus once for cleaning and to be then mounted again to the electron beam proximity exposure apparatus, the electron beam proximity exposure apparatus is not useable for the while, which results in the lowered throughput.

Since the mask is arranged in proximity to an object, on which a resist layer is applied, with a distance for example about 50 μm away from each other, the mask easily soils with vapor generated from the resist layer and the soil causes charging-up of the mask, which results in an error of an irradiating position. When the mask is soiled, the mask has to be taken out of the apparatus for cleaning or the surface of the mask has to be cleaned by such as plasma-ashing in which ozone is introduced into the chamber. In both cases, the exposure by the electron beam proximity exposure apparatus has to be stopped once for cleaning the mask, which causes the problem of the lowered throughput.

Furthermore, in a case that the mask's minimum line width is not more than 0.2 μm, the thickness of the mask portion needs to be not more than 0.8 μm. According to the electron beam proximity exposure apparatus disclosed in U.S. Pat. No. 5,831,272, the intensity of the electron beam irradiated to the mask is considerably small and the damage of the mask by the irradiated electron beam is extremely small. In spite of it, the mask that is used for a long time is deteriorated and then has a white defect, and the mask thereby becomes unusable. In such a case, the mask is taken out of the electron beam proximity exposure apparatus, corrected by the correcting device, and then mounted again or a new mask is mounted. In both cases, the exposure by the electron beam proximity exposure apparatus has to be stopped once for correcting or replacing the mask, which causes the problem of the lowered throughput.

SUMMARY OF THE INVENTION

The present invention has been developed in view of the above-described circumstances, and has as its object the improvement of a throughput by reducing a frequency of taking a mask out of an apparatus in order to change the complementary masks, to clean and correct the mask, and to substitute a new mask.

In order to achieve the above-described object, the electron beam proximity exposure apparatus according to the present invention uses a single mask substrate on which a plurality of masks are formed, and has a mask moving mechanism to move the mask substrate, so that the mask used in an exposure can be selected from the plurality of the masks.

An electron beam proximity exposure apparatus according to present invention is characterized in that the apparatus comprises: an electron beam source which emits a collimated electron beam; a mask substrate on which a plurality of masks with apertures are formed; a mask moving mechanism which moves the mask substrate; and a stage which holds and moves an object, wherein the mask moving mechanism moves the mask substrate so that one of the plurality of masks is arranged on a path of the electron beam in proximity to a surface of the object, and a pattern corresponding to the aperture of the one of the plurality of masks is exposed on the surface of the object with the electron beam having passed through the aperture.

According to the electron beam proximity exposure apparatus of the present invention, the mask to be used can be substituted without taking the mask substrate out of the apparatus, which reduces the lowered throughput at the time of exchanging the masks. Although the substitutable mask is naturally one of the masks formed on the mask substrate, and the mask substrate is required to be taken out of the apparatus once for replacing in a case that the mask that is not formed on the mask substrate is substituted, a frequency of exchanging the mask substrates can be extremely reduced by providing pairs of complementary masks and a plurality of the masks having the same pattern on the mask substrate.

Each portion for the mask is required to be a very thin film. Preferably, the plurality of the masks are arranged to have some distances away from each other on the mask substrate, and only the portions for the masks are thin while the rest of the portions is a thick base.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

An electron beam exposure apparatus according to an embodiment of the present invention has a structure similar to that shown in FIG. 1, although contains different points such that the apparatus comprises a mask unit having a plurality of masks instead of a mask 30, and a mask stage 36 has a bigger moving range so that each of the plurality of masks can be positioned on the path of the electron beam.

Figure 4:
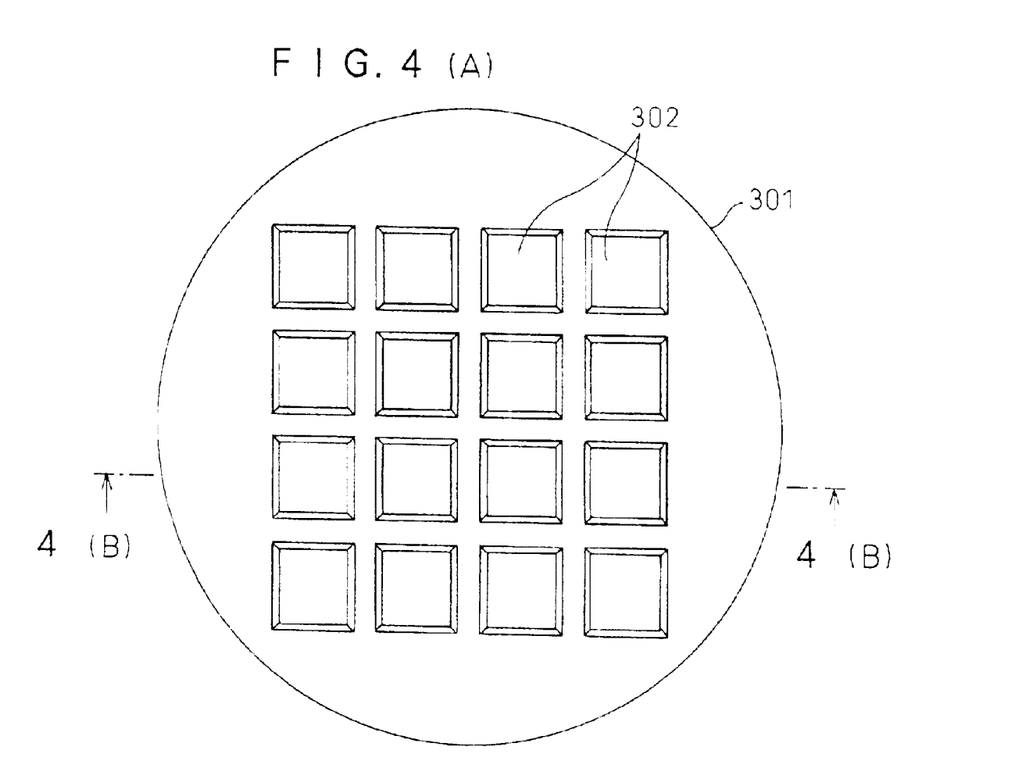
FIG. 4(A) is a view showing a mask unit according to an embodiment of the present invention.
FIG. 4(B) is a sectional view taken along line 4(B)—4(B) in FIG. 4(A)

FIGS. 4(A) and 4(B) are a plan view and a sectional view, respectively, of the mask unit according to an embodiment of the present invention.

Figure 2:
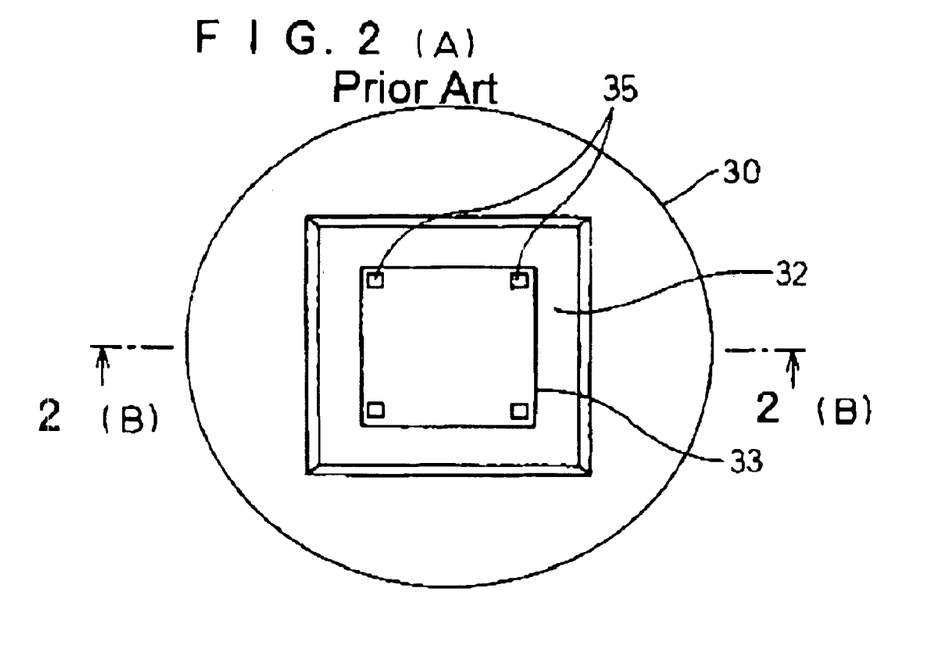
FIG. 2(A) is a view showing a mask used in the electron beam proximity exposure apparatus.
FIG. 2(B) is a sectional view taken along line 2(B)—2(B) in FIG. 2(A)

As shown in FIG. 4(A), a mask unit 301 has sixteen masks 302. Each mask 302 has a shape similar to a portion denoted with the reference number 32 in FIG. 2, in which it is processed in the thickness of a few micrometers or submicrometers and an aperture pattern and a positioning mark are formed within. The masks 302 are formed with some distances away from each other.

As shown in FIG. 4(B), a portion of each mask 302 is processed in the thickness of a few micrometers or submicrometers, while the rest of the portions remains in the thickness of the substrate to prevent the mask unit 301 from warping.

Figure 5:
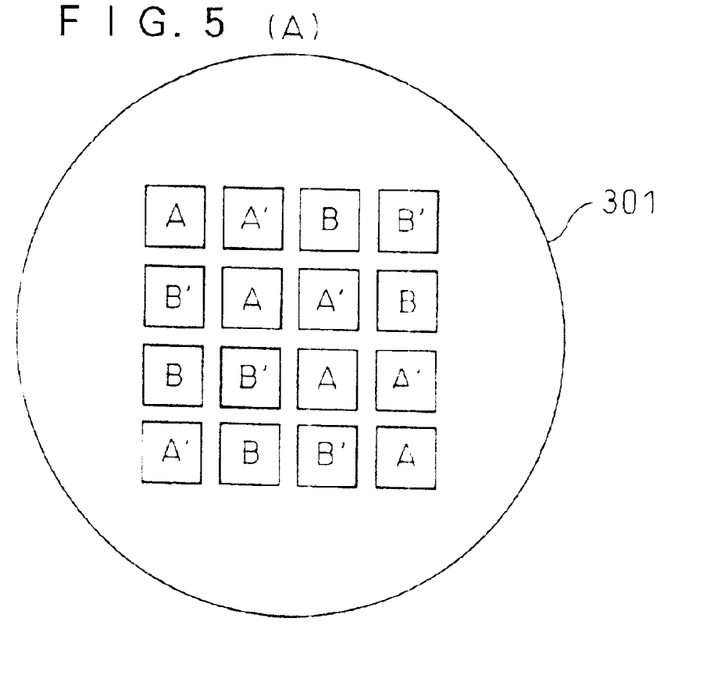
FIGS. 5(A) and 5(B) are views showing an arrangement and a kind of the masks arranged on the mask unit.

FIGS. 5(A) and 5(B) are drawings showing examples of a pattern formed on the sixteen masks of the mask unit 301. FIG. 5(A) shows an example of forming four pairs of complementary masks A and A' of a first pattern and four pairs of complementary masks B and B' of a second pattern. Using such grouped patterns, the first pattern and the second pattern can be exposed without taking the mask unit 301 out of the apparatus to exchange. For example, in order to expose the first pattern, one of the masks A is moved into the path of the electron beam, and then chips (dies) of an object (wafer) mounted on the stage are moved into the exposure position to perform exposure one by one. After completing the exposure of all chips, one mask A' is moved into the path of the electron beam and the same procedure is repeated. Thus, every chip of the wafer is exposed with the first pattern. The same procedure is performed for the second pattern's exposure.

In a case that one kind of masks that is, for example, one of the masks A is soiled or damaged and becomes unable to expose a correct pattern, the other three masks A are used. Accordingly, the mask unit does not have to be replaced until all four of the identical masks become unusable.

FIG. 5(B) is an example of forming eight kinds of pattern for the complementary masks; A and A', B and B', C and C', D and D', E and E', F and F', G and G', and H and H'. Using such a pattern set, the eight kinds of pattern can be exposed without taking the mask unit 301 out of the apparatus to exchange. However, when one of the masks is damaged, the pattern of the one mask becomes unable to be exposed and the mask unit 301 is hence required to be replaced for exposing the pattern. Accordingly, the pattern set in FIG. 5(B) is suitable for a case that a number of the exposure is a few compared with durability of the mask.

FIGS. 6(A)–6(D) are drawings illustrating a method of manufacturing the mask unit.

Figure 6:
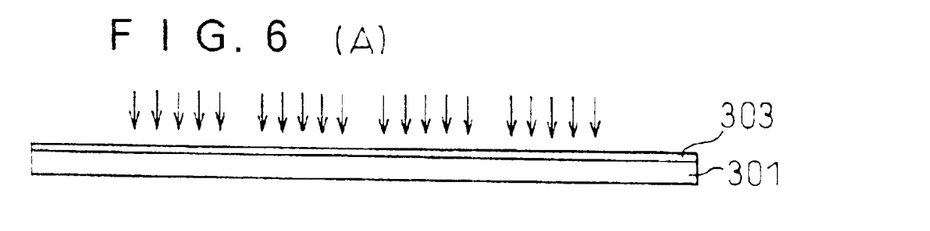
FIGS. 6(A), 6(B), 6(C) and 6(D) are views showing a method of forming the mask unit.

As shown in FIG. 6(A), a resist layer 303 is applied on a first surface of the substrate of the mask unit 301, and the aperture pattern is exposed on each portion of the sixteen masks. Then, the resist of the aperture parts is removed by developing the resist, and holes 304 are formed as shown in FIG. 6(B) by etching the first surface. The holes correspond to the aperture pattern and are made a little deeper than the finished mask's thickness (the thickness of the portion denoted with the reference number 32 in FIG. 2(A)).

Next, as shown in FIG. 6(C), a resist layer 305 is formed on a portion of a second surface except for a portion corresponding to the portion denoted with the reference number 32 in FIG. 2(A), and the second surface is etched so as to make the portions denoted with the reference number 32 have the thickness of the finished mask. Thereby, the aperture parts 304 in FIG. 6(B) are perforated and the aperture pattern is formed. The mask unit is thus formed as shown in FIG. 6(D).

Figure 7:
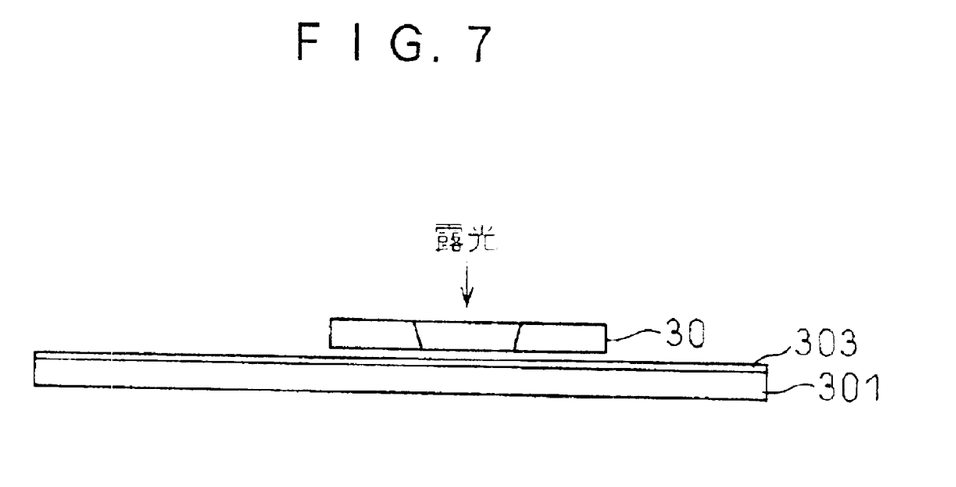
FIG. 7 is a view showing an example of exposing a pattern of each mask of the mask unit.

When the aperture pattern is exposed on each portion of the masks as shown in FIG. 6(A), each aperture pattern may be exposed one by one with a conventional electron beam exposure apparatus that can expose a desired pattern; however, it takes an extremely long time to expose one mask. To solve this problem, the following procedure can be performed when there are a plurality of the masks of the identical pattern as shown in FIG. 5(A): a single mask is produced, the mask is then mounted to the electron beam proximity exposure apparatus shown in FIG. 1, and a plurality number of the exposure are performed at the predetermined portions of the substrate of the mask unit 301 as shown in FIG. 7. A time for exposing the mask unit can be thereby shortened.

As described in the above, according to the present invention, by producing a master mask once, masks to be used for practical exposing of the object can be easily manufactured at the reduced costs, and even though the mask's durability is low, it less influences manufacturing costs of semiconductor devices. Furthermore, the mask is copied form the master mask by the electron beam proximity exposure method, which can correct distortion, so that the mask that is obtained in the end is a fine mask with less distortion.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. An electron beam proximity exposure apparatus, comprising:

an electron beam source which emits a collimated electron beam;

a mask substrate on which a plurality of masks with apertures are formed;

a mask moving mechanism which moves the mask substrate; and a stage which holds and moves an object, wherein the mask moving mechanism moves the mask substrate so that one of the plurality of masks is arranged on a path of the electron beam in proximity to a surface of the object, and a pattern corresponding to the aperture of the one of the plurality of masks is exposed on the surface of the object with the electron beam having passed through the aperture, wherein at least two of the plurality of masks formed on the mask substrate have an identical pattern.

2. The electron beam proximity exposure apparatus as defined in claim 1, wherein:
the plurality of masks are arranged with a distance away from each other on the mask substrate; and
portions of the plurality of the masks of the mask substrate are thinner than other portions.

3. The electron beam proximity exposure apparatus as defined in claim 1, wherein:
the plurality of masks are arranged with a distance away from each other on the mask substrate; and
portions of the plurality of the masks of the mask substrate are thinner than other portions.

4. The electron beam proximity exposure apparatus as defined in claim 1, wherein:
each pattern exposed on the object is exposed by two exposures in which a first mask and a second mask are respectively used; and
the plurality of masks formed on the mask substrate comprise a set of the first mask and the second mask.

5. The electron beam proximity exposure apparatus as defined in claim 4, wherein:
the plurality of masks are arranged with a distance away from each other on the mask substrate; and
portions of the plurality of the masks of the mask substrate are thinner than other portions.

6. The electron beam proximity exposure apparatus as defined in claim 4, wherein:
the plurality of masks are arranged with a distance away from each other on the mask substrate; and
portions of the plurality of the masks of the mask substrate are thinner than other portions.

7. A mask unit which is used in an electron beam proximity exposure apparatus comprising an electron beam source which emits a collimated electron beam, a mask with an aperture which is arranged on a path of the electron beam, and a stage which holds and moves an object, wherein the mask is arranged in proximity to a surface of the object and a pattern corresponding to the aperture of the mask is exposed on the surface of the object with the electron beam having passed through the aperture,
wherein the mask unit comprises a single mask substrate on which a plurality of the masks are formed, at least two of the plurality of masks formed on the mask substrate have an identical pattern.

* * * * *